(12) United States Patent
Waechter et al.

(10) Patent No.: US 11,629,432 B2
(45) Date of Patent: Apr. 18, 2023

(54) METALORGANIC CHEMICAL VAPOR PHASE DEPOSITION APPARATUS HAVING BUBBLER WITH FIRST SUPPLY SECTION LEADING TO REACTOR, FIRST, SECOND AND THIRD MASS FLOW CONTROLLER AND PRESSURE SENSOR

(71) Applicant: AZUR SPACE Solar Power GmbH, Heilbronn (DE)

(72) Inventors: Clemens Waechter, Lauffen am Neckar (DE); Jan Strate, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/211,503

(22) Filed: Mar. 24, 2021

(65) Prior Publication Data

US 2021/0301423 A1 Sep. 30, 2021

(30) Foreign Application Priority Data

Mar. 24, 2020 (DE) ..................... 10 2020 001 894.7

(51) Int. Cl.
*C30B 35/00* (2006.01)
*C30B 25/16* (2006.01)

(52) U.S. Cl.
CPC ............ *C30B 35/00* (2013.01); *C30B 25/165* (2013.01)

(58) Field of Classification Search
CPC ......... C30B 25/00; C30B 25/02; C30B 25/14; C30B 25/16; C30B 25/165; C30B 35/00; C30B 35/005; C30B 35/007; C23C 16/44; C23C 16/448; C23C 16/4481; C23C 16/4482; C23C 16/455; C23C 16/45512; C23C 16/45561
See application file for complete search history.

(56) References Cited

U.S. PATENT DOCUMENTS

| 10,109,483 | B2 | 10/2018 | Takahashi et al. |
| 2012/0018037 | A1 | 1/2012 | Nakagawa et al. |
| 2015/0322567 | A1 | 11/2015 | Hidaka et al. |

(Continued)

FOREIGN PATENT DOCUMENTS

| DE | 102015221830 A1 | 5/2016 |
| DE | 112015000489 T5 | 11/2016 |

(Continued)

*Primary Examiner* — Kenneth A Bratland, Jr.
(74) *Attorney, Agent, or Firm* — Muncy, Geissler, Olds & Lowe, P.C.

(57) ABSTRACT

A Metalorganic chemical vapor phase epitaxy or vapor phase deposition apparatus, having a first gas source system, a reactor, an exhaust gas system, and a control unit, wherein the first gas source system has a carrier gas source, a bubbler with an organometallic starting compound, and a first supply section leading to the reactor either directly or through a first control valve, the carrier gas source is connected to an inlet of the bubbler through a first mass flow controller by a second supply section, an outlet of the bubbler is connected to the first supply section, and the carrier gas source is connected to the first supply section through a second mass flow controller by a third supply section, the first supply section is connected to an inlet of the reactor through a third mass flow controller.

7 Claims, 2 Drawing Sheets

(56) References Cited

U.S. PATENT DOCUMENTS

| | | | | |
|---|---|---|---|---|
| 2016/0133457 A1* | 5/2016 | Takahashi | ......... | H01L 21/02579 137/861 |
| 2017/0121814 A1 | 5/2017 | Caymax | | |
| 2017/0145564 A1 | 5/2017 | Bertuch et al. | | |
| 2017/0362701 A1* | 12/2017 | Logue | ................... | C23C 16/448 |
| 2018/0179628 A1* | 6/2018 | Hashimoto | ......... | C23C 16/4482 |

FOREIGN PATENT DOCUMENTS

| | | | |
|---|---|---|---|
| EP | 3162914 A1 | | 5/2017 |
| JP | 2015122455 A | * | 7/2015 |

\* cited by examiner

METALORGANIC CHEMICAL VAPOR PHASE DEPOSITION APPARATUS HAVING BUBBLER WITH FIRST SUPPLY SECTION LEADING TO REACTOR, FIRST, SECOND AND THIRD MASS FLOW CONTROLLER AND PRESSURE SENSOR

This nonprovisional application claims priority under 35 U.S.C. § 119(a) to German Patent Application No. 10 2020 001 894.7, which was filed in Germany on Mar. 24, 2020 and which is herein incorporated by reference.

BACKGROUND OF THE INVENTION

Field of the Invention

The present invention relates to a metalorganic chemical vapor phase epitaxy or vapor phase deposition apparatus.

Description of the Background Art

Metalorganic chemical vapor phase epitaxy is widespread for producing semiconductor components. An extremely wide variety of vapor phase epitaxy systems are known, such as those from the Aixtron company, for the epitaxial production of semiconductor layers. Such systems are also called MOVPE systems.

Vapor phase epitaxy systems have in common that the epitaxial layers are deposited or grown from the gas phase on a substrate placed in a reaction chamber. Upstream of the reaction chamber is a gas source system that provides the required elements in a precisely defined mixture ratio, hereinafter referred to as composition, in the gas phase for a growth of layers in MOVPE.

The constituents of the layers are assembled from compounds called precursors. Often, the precursors are present in liquid or solid form in a vapor pressure saturator, also called a bubbler, and must be converted to a gaseous state with the aid of a carrier gas for the epitaxy process. For this purpose, the carrier gas is conducted through the vapor pressure saturator. As a result of the vapor pressure of the precursor material, which depends on the temperature and the pressure of the precursor material in the vapor pressure saturator among other factors, a specific quantity of the precursor material vaporizes and is transported by means of the carrier gas.

Depending on the layer system to be deposited, it is necessary to change the makeup of the gases quickly in terms of time. For this purpose, the flow of the carrier gas is varied, while the pressure and temperature of the precursor material are kept constant.

The temperature of the precursor material is kept constant using appropriate technical measures, such as by a thermal bath, for instance.

In order to change the makeup of the composition, the pressure of the gas source could likewise be varied, but in many cases the vapor pressure saturators in a production environment contain a volume of several liters. It is a disadvantage here that a pressure change entails the exchange of a large quantity of gas, and the system does not arrive at a stable and defined state until after a relatively long period of time. Defined layer growth is not possible during the settling time.

This has the result that both pressure and temperature are kept constant in the vapor pressure saturator, and only the flow of the carrier gas is varied to adjust the makeup of the gas in the reactor.

In this case the flow of the carrier gas at the intake of the vapor pressure saturator is varied with a mass flow controller, and the pressure in the vapor pressure saturator is kept constant with a pressure controller. In a steady state, exactly as much gas as is delivered by the mass flow controller to the vapor pressure saturator flows through the pressure controller, and the desired proportioning is achieved.

In an alternative prior art, the roles of the two controllers are swapped, and the pressure controller delivers enough gas to the vapor pressure saturator that a constant pressure is achieved, and a mass flow regulator regulates the flow into the reactor. To produce the layer structure, both the aforementioned pressure controller and the aforementioned mass flow controller are connected to a control unit. Additional mass flow controllers can also be involved in order to dilute the gas from the vapor pressure saturator or to complete a total flow.

At present, the mass flow controller and the pressure controller each separately constitute an independent regulating unit, wherein the regulating units each obtain set points from the higher-level control unit.

It is a disadvantage that the pressure controller, for example, is not designed to produce a flow that is as constant as possible. If the flow through the vapor pressure saturator changes, then the pressure in the vapor pressure saturator also changes until the pressure controller detects the change and attempts to stabilize the pressure. During the stabilization, however, the flow of the carrier gas containing the precursor materials is accomplished either through discharging the carrier gas into the reactor or the exhaust gas system, or through an accumulation.

The return to a stable state takes several seconds, depending on the size of the vapor pressure saturator, and involves quite marked flow changes. During this time, the gas source is not available for the growth of a stable layer structure.

SUMMARY OF THE INVENTION

It is therefore an object of the present invention to provide an apparatus that advances the state of the art.

According to the subject matter of the invention, a metalorganic chemical vapor phase epitaxy or vapor phase deposition apparatus is provided.

The vapor phase epitaxy or vapor phase deposition apparatus has a first gas source system, a reactor, an exhaust gas system, and a control unit.

The first gas source system has a carrier gas source, a bubbler with an organometallic starting compound, and a first supply section leading to the reactor either directly or through a first control valve.

The carrier gas source is connected to an inlet of the bubbler through a first mass flow controller by means of a second supply section.

An outlet of the bubbler is connected to the first supply section.

The carrier gas source is connected to the first supply section through a second mass flow controller by means of a third supply section.

In addition, the first supply section is connected to an inlet of the reactor through a third mass flow controller, downstream after the connection to the outlet of the bubbler and after the connection to the third supply section.

The gas-mixing system has a pressure sensor on the first supply section or on the second supply section, or the pressure sensor is flange-mounted directly on the bubbler.

For epitaxial growth in a vapor phase epitaxy or vapor phase deposition apparatus, a total gas flow in the reactor is conducted over a substrate. The total gas flow contains all elements necessary for a layer to be grown or deposited, for example elements of the III and/or V main group and/or dopants. Examples of this are binary, ternary, or quaternary layers, preferably of GaAs, InGaAs, InGaP, InGaAsP. It is a matter of course that the layers are usually doped, in particular with silicon or zinc or tellurium.

Typically, multiple individual gas flows are brought together at the entrance of the reactor or in the reactor for the total gas flow, wherein each individual gas flow has at least one of the necessary elements.

"Gas source system" can refer to a unit that provides an individual gas flow for at least one element, which is to say a gas mixture composed of a carrier gas and a precursor for an element to be deposited. For this purpose, the gas source system has, in particular, the carrier gas source and a bubbler.

"Bubbler" can refer to a vapor pressure saturator that is designed to conduct a carrier gas through a precursor located in the bubbler. The precursor, e.g., TMGa, is present in the bubbler in liquid form, for example, wherein an equilibrium vapor pressure arises above the precursor liquid as a function of a bubbler temperature.

The gas mixture composed of the carrier gas, e.g., $H_2$ or $N_2$, and gaseous precursor compounds is conducted out of the bubbler to the reactor.

"Precursor" can refer to molecules that serve as a starting product for epitaxial growth. Accordingly, a precursor is a molecule formed of an element to be grown, for example an element from the III or V main group or a dopant, and at least one additional element.

It is a matter of course that the vapor phase epitaxy or vapor phase deposition apparatus may, if applicable, have additional gas source systems for additional precursors in order to produce layers from multiple elements, for example gallium arsenide (GaAs) or aluminum gallium arsenide (AlGaAs), and/or layers with dopants such as silicon or tellurium.

Mass flow controllers are also referred to as mass flow rate controllers, and serve to regulate the mass flow in question through the supply section in question to a desired value.

It is a matter of course that each mass flow controller may have a mass flow sensor for this purpose, e.g., a calorimetric flow sensor or a Coriolis mass flow sensor, as well as a proportional valve and a separate regulating unit and/or interface to the control unit of the vapor phase epitaxy apparatus.

It should be noted that the reactor is connected to the exhaust gas system by means of a discharge section.

According to the background prior art, as initially mentioned, the gas saturation is regulated through the pressure by means of a pressure controller. The pressure controller in this case is arranged in the second supply section between the carrier gas source and the vapor pressure saturator, or more often between the vapor pressure saturator and the reactor in the first supply section, and in this way replaces the first or the third mass flow regulator of the present invention.

Pressure regulation in place of mass flow regulation does result in stable mixture ratios when there are constant gas flows over a relatively long period, but the regulation is insufficiently reproducible because of the slow transient response with poorly defined flow ratios when there are changes in the gas flow. Specifically in the case of layer sequences, in particular with layer thicknesses below 1 μm or less than 100 nm or less than 10 nm, regulation by means of pressure according to the prior art results in variations in the thickness and the composition of the layers.

Particularly in the case of large vapor pressure saturators with a volume of multiple liters, the previous pressure controllers are not designed for constant flow as is required for the application. One reason is that with pressure regulation according to the prior art, a large volume must be let into the reactor or into the exhaust gas system in order to achieve a small pressure change. Varying composition in the gas flows is the consequence.

In the invention, the flow in the gas source is determined solely by mass flow regulators. A pressure controller is unnecessary.

According to the invention, the pressure can be adjusted by the regulating unit by means of the mass flow rate controller. For this purpose, the pressure that is measured in the first or second supply section or directly at the bubbler serves only as an input quantity.

Because the pressure changes only slowly in the event of a changed flow situation or a changed composition on account of the preferably high volume of the vapor pressure saturator, however, the pressure can now be guided by means of the regulating unit with prioritization of a stable flow into the reactor.

In an example of the invention, the flow balance through the gas source is regulated as a whole by the regulating unit, which is to say that in contrast to the prior art, individual control for independent controllers does not occur, but instead the regulation of all mass flow regulators involved is accomplished while taking into account the overall balance.

It follows from this that it is unimportant for implementation of the invention whether the pressure is measured in the first or second supply section or directly at the bubbler for this purpose. The different measurement points have a similar pressure in accordance with the flow balance.

Preferably, the cross-sections of the line sections are suitably dimensioned to keep low the dynamic pressure owing to the flow of gas, with the result that the concrete measurement location has little effect on the pressure stabilization.

With appropriate control, even flow behaviors over time can be consistently reproduced. Particularly when large bubblers are used, a very stable gas flow with a defined gas saturation is achieved, even when there are brief changes in the composition of the gas flow.

Preferably, for this purpose a pressure change owing to a changed desired flow value is anticipated and counterbalanced in advance by an adjustment of the other flows in the system. A pressure change is prevented in this way. No additional regulating unit is needed for this purpose.

According to another example, the first supply section can be connected to the exhaust gas system through a fourth mass flow controller, downstream after the connection to the third supply section and ahead of the third mass flow controller.

In another example, the control unit can be designed to read out pressure values of the pressure sensor and to regulate one or more or all mass flow controllers of the gas-mixing system while taking into account the pressure values that have been read out.

The control unit can be designed to regulate the first mass flow controller and/or the second mass flow controller and/or the fourth mass flow controller while taking into account a mass flow through the third mass flow controller.

In another embodiment, the first supply section has, parallel to a line section that contains the third mass flow controller, a line section with a pressure controller, wherein either the line section that contains the third mass flow controller or the line section of the first supply section that contains the pressure controller is shut off at a given time.

The pressure sensor can be flange-mounted directly on the bubbler.

The bubbler can contain a solid precursor. In this design, the short and long pipe lengths can be swapped in their connections.

The bubbler can contain a heating coil, in particular in order to heat the solid precursor to a specified temperature.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
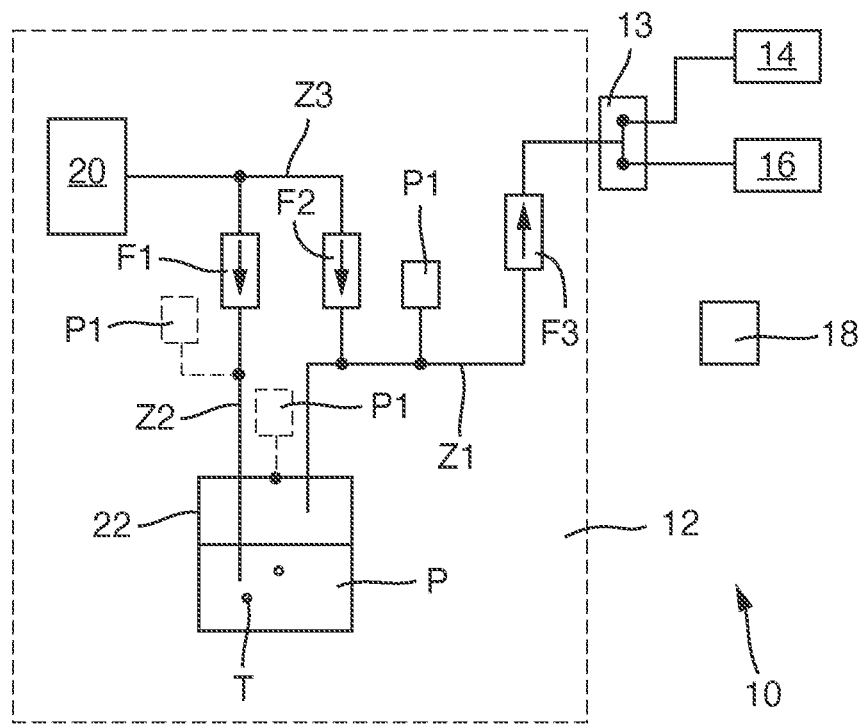
FIG. 1 shows a view of an exemplary vapor phase epitaxy or vapor phase deposition apparatus.

The illustration in FIG. 1 shows a first example of a vapor phase epitaxy or vapor phase deposition apparatus 10.

The vapor phase epitaxy or vapor phase deposition apparatus 10 has a reactor 14, a control unit 18, at least one first gas source system 12, and an exhaust gas system 16.

It should be noted that the reactor 14 a is connected to the exhaust gas system 16 by means of a discharge section that is not shown.

The gas source system 12 is connected to the reactor 14 and to the exhaust gas system 16 through a first supply section Z1 and a first control valve 13.

In addition, the gas source system 12 has a carrier gas source 20 for a carrier gas T, for example $H_2$ or $N_2$, and a bubbler 22 with, e.g., a liquid precursor P, for example TMGa.

The carrier gas is conducted from the carrier gas source 20 to an inlet of the bubbler 22 through a second supply section Z2. The carrier gas T emerges from a pipe in the region of the bottom of the bubbler 22, and rises through the precursor P in the form of bubbles.

It should be noted that, in an embodiment that is not shown, the precursor P is also implemented as a precursor P in solid form, which is to say as a solid precursor P. In this case, the short and long pipe lengths can be swapped in their connections. In another embodiment, the bubbler 22 contains a heating coil, in particular in order to heat the solid precursor P to a specified temperature.

An outlet of the bubbler 22 is connected to the first supply section Z1 in order to conduct the emerging gas mixture, which is to say the carrier gas T enriched by the precursor P, from the bubbler 22 into the reactor 14.

In addition, the carrier gas source 20 is connected to the first supply section Z1 through a third supply section Z3 after the outlet of the bubbler 22. Preferably, the gases converge in a T-piece.

The gas stream from the carrier gas source 20 to the bubbler 22 through the second supply section Z2 can be regulated by means of a first mass flow controller F1 and the gas stream from the carrier gas source 20 to the first supply section Z1 through the third supply section Z3 can be regulated by means of a second mass flow controller F2.

Arranged in the first supply section downstream after the connection to the third supply section Z3 and before the first control valve 13 is a third mass flow controller F3.

In addition, a pressure sensor P1 is arranged on the first supply section Z1 or on the second supply section Z2—drawn with dashed lines—or flange-mounted directly on the bubbler 22—drawn with dashed lines.

It is a matter of course that the pressure sensor P1 is arranged on only one of the three positions. It should also be noted that the pressure sensor P1 and the mass flow controller are each connected to a control and analysis unit. The single control and analysis unit regulates the mass flow controllers to the specified values in accordance with the specifications of the control program in this case.

Figure 2:
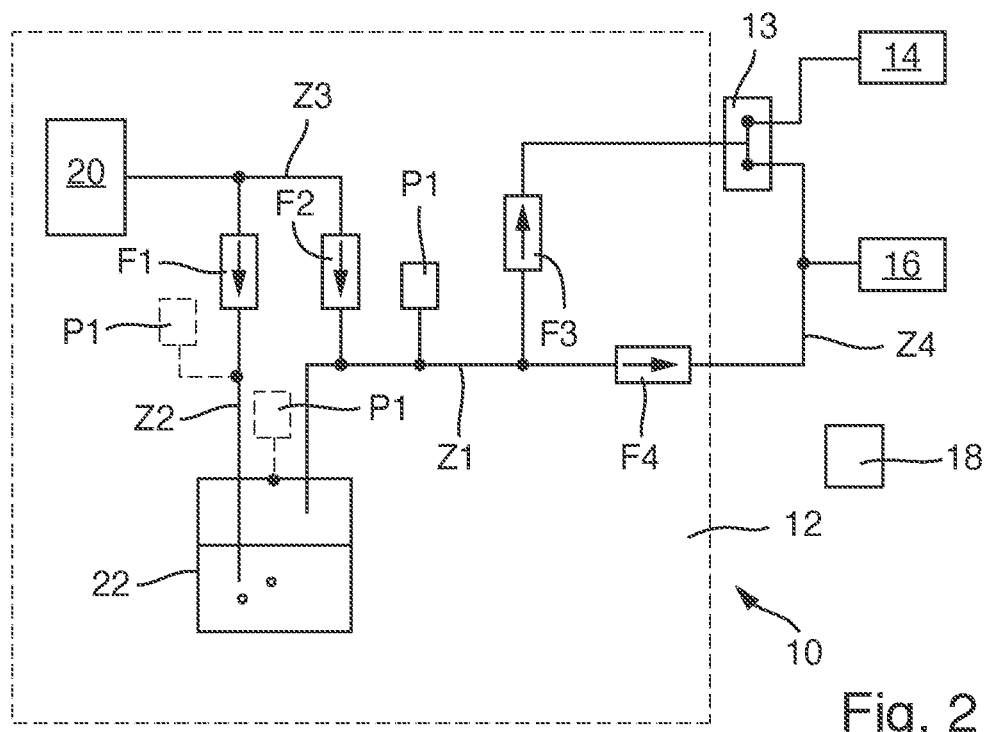
FIG. 2 shows a view of an exemplary vapor phase epitaxy or vapor phase deposition apparatus.

In the illustration in FIG. 2, another embodiment is shown. Only the differences from the illustration in FIG. 1 are explained below.

The gas source system 12 additionally has a fourth supply section Z4 with a fourth mass flow controller F4, wherein the fourth supply section connects the first supply section Z1 to the exhaust gas system 16, and for this purpose is connected to the first supply section Z1 between the pressure sensor P1 and the third mass flow controller F3.

Figure 3:
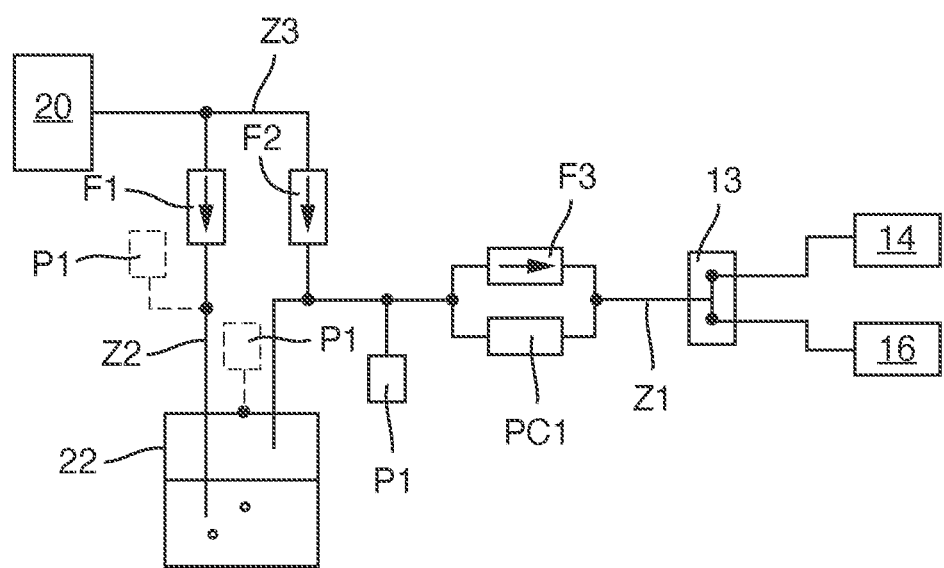
FIG. 3 shows a view of an exemplary vapor phase epitaxy or vapor phase deposition apparatus

In the illustration in FIG. 3, another embodiment is shown. Only the differences from the illustration in FIG. 1 are explained below.

The first supply section has a pressure controller PC1, wherein the pressure controller PC1 is arranged to be parallel to the third mass flow controller F3.

As a result, the first supply section has two line sections running parallel to one another, each with either the pressure controller PC1 or the mass flow controller F3.

During operation, either the third mass flow controller F3 or the pressure controller is always kept in an off state, which is to say, for example, the flow of the mass flow controller F3 is set to zero, so that the gas flow only moves through one of the two parallel line sections of the first supply section.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A metalorganic chemical vapor phase epitaxy or vapor phase deposition apparatus comprising:
   a first gas source system;
   a reactor;
   an exhaust gas system; and
   a control unit,
   wherein the first gas source system has a carrier gas source, a bubbler with an organometallic starting compound, and a first supply section leading to the reactor either directly or through a first control valve,
   wherein the carrier gas source is connected to an inlet of the bubbler through a first mass flow controller via a second supply section, wherein an outlet of the bubbler is connected to the first supply section, wherein the carrier gas source is connected to the first supply section through a second mass flow controller via a third supply section, wherein the first supply section is connected to an inlet of the reactor through a third mass flow controller downstream after the connection to the outlet of the bubbler and after the connection to the third supply section, wherein the first gas source system has a pressure sensor mounted between the first mass flow controller and the third mass flow controller in order to determine the flow in the first gas source system by the first mass flow controller, the second mass flow controller and the third mass flow controller, and wherein the first supply section has, parallel to a line section that contains the third mass flow controller and no pressure controller, a line section with a pressure controller and no mass flow controller, wherein either the line section that contains the third mass flow controller or the line section of the first supply section that contains the pressure controller is shut off at a given time.

2. The apparatus according to claim 1, wherein the control unit is designed to read out pressure values of the pressure sensor and to regulate one or more or all mass flow controllers of the first gas source system while taking into account pressure values that have been read out.

3. The apparatus according to claim 1, wherein a precursor of the bubbler is designed as a solid precursor.

4. The apparatus according to claim 1, wherein the flow in the gas source is determined solely by the first mass flow controller, the second mass flow controller and the third mass flow controller.

5. The apparatus according to claim 1, wherein the pressure sensor is mounted on the first supply section ahead of the third mass flow controller.

6. The apparatus according to claim 1, wherein the pressure sensor is mounted on the second supply section.

7. The apparatus according to claim 1, wherein the pressure sensor is flange-mounted directly on the bubbler.

* * * * *